United States Patent
Li et al.

(10) Patent No.: US 12,433,068 B2
(45) Date of Patent: Sep. 30, 2025

(54) LED WITH ALGAINP WINDOW LAYER

(71) Applicant: QUANZHOU SANAN SEMICONDUCTOR TECHNOLOGY CO., LTD, Fujian (CN)

(72) Inventors: Huiwen Li, Tianjin (CN); Dongyan Zhang, Tianjin (CN); Kuanfu Pan, Tianjin (CN); Shaohua Huang, Tianjin (CN); Duxiang Wang, Tianjin (CN)

(73) Assignee: QUANZHOU SANAN SEMICONDUCTOR TECHNOLOGY CO., LTD, Quanzhou (CN)

( * ) Notice: Subject to any disclaimer, the term of this patent is extended or adjusted under 35 U.S.C. 154(b) by 1023 days.

(21) Appl. No.: 17/483,833

(22) Filed: Sep. 24, 2021

(65) Prior Publication Data

US 2022/0013691 A1 Jan. 13, 2022

Related U.S. Application Data

(63) Continuation of application No. PCT/CN2019/079571, filed on Mar. 25, 2019.

(51) Int. Cl.
| | |
|---|---|
| H01L 33/30 | (2010.01) |
| H01L 33/40 | (2010.01) |
| H01L 33/62 | (2010.01) |
| H10H 20/824 | (2025.01) |
| H10H 20/832 | (2025.01) |
| H10H 20/857 | (2025.01) |

(52) U.S. Cl.
CPC ........ *H10H 20/824* (2025.01); *H10H 20/832* (2025.01); *H10H 20/857* (2025.01)

(58) Field of Classification Search
CPC ...................................................... H01L 33/30
See application file for complete search history.

(56) References Cited

U.S. PATENT DOCUMENTS

| | | | | |
|---|---|---|---|---|
| 2011/0003415 | A1* | 1/2011 | Hon | H01L 33/0093 |
| | | | | 257/E33.068 |
| 2012/0305979 | A1* | 12/2012 | Nabekura | H01L 33/38 |
| | | | | 438/26 |
| 2015/0236204 | A1* | 8/2015 | Wang | H01L 33/38 |
| | | | | 438/22 |

(Continued)

FOREIGN PATENT DOCUMENTS

| | | | | |
|---|---|---|---|---|
| CN | 102822999 A | * | 12/2012 | ............. H01L 33/20 |
| CN | 104934510 A | | 9/2015 | |

(Continued)

*Primary Examiner* — Peter Bradford

(57) ABSTRACT

A semiconductor light-emitting device includes a semiconductor light-emitting sequence which includes a first conductive type semiconductor layer, a second conductive type semiconductor layer and a light-emitting layer therebetween, a first electrode electrically connected to the first conductive type semiconductor layer, and a second electrode electrically connected to the second conductive type semiconductor layer. The first conductive type semiconductor layer includes an aluminum gallium indium phosphorus window layer as an ohmic contact layer forming contact between the first electrode and the first conductive type semiconductor layer.

17 Claims, 5 Drawing Sheets

(56) References Cited

U.S. PATENT DOCUMENTS

| | | | | |
|---|---|---|---|---|
| 2015/0372196 A1* | 12/2015 | Matsumura | ............ | H01L 33/44 |
| | | | | 257/99 |
| 2016/0163929 A1* | 6/2016 | Jeong | ..................... | H01L 33/38 |
| | | | | 257/13 |
| 2018/0166609 A1* | 6/2018 | Wu | ......................... | H01L 33/14 |

FOREIGN PATENT DOCUMENTS

| | | | |
|---|---|---|---|
| CN | 104952993 | A | 9/2015 |
| CN | 108417677 | A | 8/2018 |
| JP | 2001068730 | A | 3/2001 |
| TW | 201214768 | A1 | 4/2012 |

* cited by examiner

LED WITH ALGAINP WINDOW LAYER

This application is a continuation application of International Application No. PCT/CN2019/079571 filed Mar. 25, 2019, the entirety of which is incorporated herein by reference.

TECHNICAL FILED

The present invention relates to a semiconductor light-emitting device, in particular to a semiconductor light-emitting device with electrodes for wire bonding.

BACKGROUND

Light-emitting diodes are semiconductor devices that convert electrical energy into light. Compared to fluorescent and incandescent bulbs, LEDs offer advantages such as low power consumption, semi-permanent life cycle, fast response, safety, and environmental friendliness, and are increasingly used as lighting devices such as various lamps and street lights, lighting units for liquid crystal display devices, and other lighting sources for indoor and outdoor applications.

The quaternary system aluminum gallium indium phosphor-based red light-emitting diodes have been widely used in many areas such as displays, traffic lights, and automotive lights. However, to further expand the application market into high-end lighting, projection and other fields, it is necessary to continue to improve the luminous efficiency and solve the current congestion problem.

The thermal conductivity of silicon substrates is higher than that of GaAs. A current method for commercialization is to use bonding process to realize the transfer of quaternary aluminum gallium indium phosphorus epitaxial layer to silicon substrate. However, after the transfer, the n-type epitaxial layer reverses to upward, and the contact layer and electrode layer need to be formed on the n-type GaAs epitaxial layer. The current will be conducted vertically below the contact electrode, and the light emitted below the electrode will be blocked by the electrode. Although reducing the electrode can reduce the light blocking and help to improve the light extraction efficiency, the small electrode will cause the current crowding and high voltage. On the other hand, GaAs is often used as the n-side electrode window layer, which will absorb light at light-emitting side, resulting in light loss.

SUMMARY

The present invention provides a semiconductor light-emitting device which includes a semiconductor light-emitting sequence. The semiconductor light-emitting sequence includes a first type conductive semiconductor layer, a second type conductive semiconductor layer, and a light-emitting layer between the first type conductive semiconductor layer and the second type conductive semiconductor layer. The semiconductor light-emitting sequence includes a first electrode electrically connected to the first type conductive semiconductor layer, and a second electrode electrically connected to the second type conductive semiconductor layer. The first conductive type semiconductor layer includes an aluminum gallium indium phosphorus window layer as an ohmic contact layer forming contact between the first electrode and the first conductive type semiconductor layer.

DESCRIPTION OF EMBODIMENTS

The present disclosure will be explained in details with reference to the accompanying drawings. Before further description, it should be understood, however, that various modifications and changes may be made to these embodiments. Therefore, the present disclosure is not limited to the embodiments below. It should also be understood that the scope of the present disclosure should only be subjected to the scope defined in the claims and the embodiments are merely for purposes of illustration, rather than restricting. Unless otherwise specified, all technical and scientific words shall have the same meanings as understood by persons skilled in the art.

Embodiment I

Figure 1:
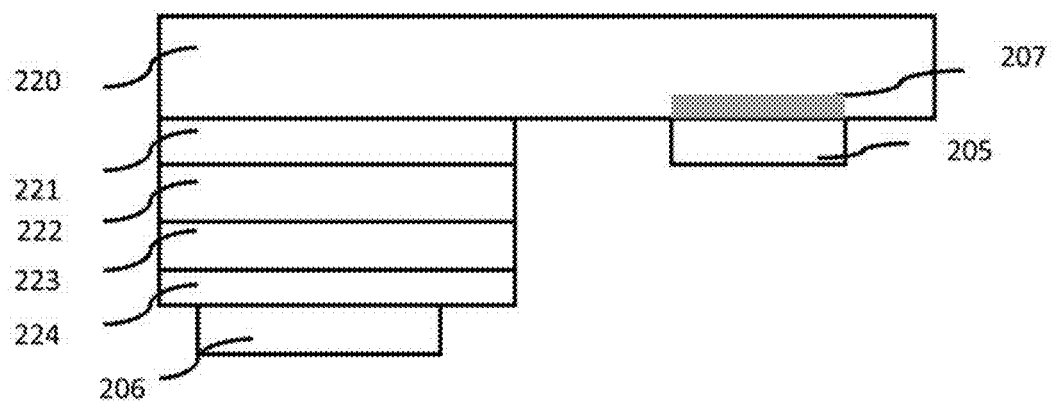
FIG. 1 is a schematic diagram of a structure of the semiconductor light-emitting device according to the embodiment I.

This embodiment provides a semiconductor light-emitting device as follows. As shown in FIG. 1, it includes an aluminum gallium indium phosphorus-based semiconductor light-emitting sequence which includes a first conductive type semiconductor layer, a light-emitting layer 222 and a second conductive type semiconductor layer. The light-emitting layer 222 has a material capable of providing light radiation, specifically in the radiation band between 550 nm and 950 nm, such as red, yellow, orange and infrared light. Specifically, the material includes aluminum gallium indium phosphorus which can be a single quantum well or multi-quantum well. The first conductive type semiconductor layer and the second conductive type semiconductor layer of the semiconductor light-emitting sequence include a first cladding layer and a second cladding layer which provide electrons or holes for the light-emitting layer, respectively, such as aluminum gallium indium phosphorus or aluminum indium phosphorus. More preferably, aluminum indium phosphorus acts as the first cladding layers 221 and the second cladding layer 223. The first conductive type or the second conductive type is n-type or p-type doping, respectively. The dopants for the n-type doping includes n-type dopants such as Si, Ge, or Sn. The dopants for the p-type doping includes p-type dopants such as Mg, Zn, Ca, Sr, or Ba. Other substituted dopants of equivalent elements are not excluded.

The semiconductor light-emitting device has two opposite sides, one of which is a light-emitting side, and the other side is used to prepare a first electrode 205 and a second electrode 206. The first conductive type semiconductor layer is closer to the light-emitting side than the second conductive type semiconductor layer in the thickness direction. The doping of the first conductive type semiconductor layer can be n-type doping or p-type doping. The first electrode 205 is in contact with the first conductive type semiconductor layer to achieve electrical connection, and the second electrode 206 is in contact with the second conductive type semiconductor layer to achieve electrical connection.

Specifically, the first conductive type semiconductor layer includes a first window layer that provides ohmic contact between the first electrode and the first conductive type semiconductor layer and current spreading, and the second conductive type semiconductor layer includes a second window layer that provides ohmic contact between the second electrode and the second conductive type semiconductor layer and current spreading.

In an embodiment, as shown in Table I, a major portion of a semiconductor light-emitting sequence of a light-emitting device is provided. The first conductive type semiconductor layer is n-type doped and includes an n-type first cladding layer 221 and an n-type first window layer 220. The second conductive type semiconductor layer includes a p-type second cladding layer 223 and a p-type second window layer 224. The light-emitting layer 222 is a multiple quantum well (MQW) having an interlacing well-barrier structure with a material of $Al_{n1}Ga_{1-n1}InP/Al_{n2}Ga_{1-n2}InP$ ($0 \leq n1 < n2 \leq 1$).

TABLE I

| No. | Functional Layer | Material | Thickness (nm) | Function |
|---|---|---|---|---|
| 224 | p-type second window layer | GaP | 500~5000 | Ohmic contact, Current spreading |
| 223 | p-type second cladding layer | AlInP + Mg | 50~5000 | Providing holes |
| 222 | Light-emitting layer MQW | $Al_{n1}Ga_{1-n1}InP/Al_{n2}Ga_{1-n2}InP$ ($0 \leq n1 < n2 \leq 1$) | 2~50 pairs | The light-emitting layer is the main factor that determines the wavelength and brightness of emitted light |
| 221 | n-type cladding layer | AlInP + Si | 50-5000 | Providing electrons |
| 220 | First window layer | $Al_{x1}Ga_{(1-x1)}InP$ | 2000~6000 | Ohmic contact |

The first window layer 220 of the first conductive type semiconductor layer is directly located at the light-emitting side, and the first window layer 220 is aluminum gallium indium phosphorous which is specifically expressed as $Al_{x1}Ga_{(1-x1)}InP$, where x1 is between 0.4 and 1. The high amount of aluminum can effectively reduce the light absorption effect of the window layer on the radiation from the light-emitting layer. More preferably, x1 is between 0.6 and 0.8, which can ensure that crystal lattices of the aluminum gallium indium phosphorus and an epitaxial growth substrate such as gallium arsenide are well matched to obtain good growth quality of aluminum gallium indium phosphorus. Preferably, in order to ensure the horizontal current spreading, the thickness of the first window layer 220 is 2~6 μm, more preferably 3~5 μm. The first window layer has a preferable doping concentration of 1E18 atoms/cm$^3$ or more, and its doping type is the same as that of the first conductive type semiconductor layer. The doping concentration is more preferably 1~2E18 atoms/cm$^3$. A lower doping concentration will cause the ohmic contact resistance to be too high, and a higher doping concentration will cause light absorption and reduce the light emitting efficiency. A surface of the first window layer 220 at the light-emitting side can be roughened or surface patterned to improve light-emitting efficiency. The doping concentration of the p-type second window layer GaP is preferably between 5E17 atoms/cm$^3$ and 9E19 atoms/cm$^3$.

The first electrode 205 is electrically connected to the first window layer 220 of the first conductive type semiconductor layer, and an hole or a mesa is formed from the second conductive type semiconductor layer side to expose the first window layer of the first conductive type semiconductor layer. The first electrode 205 extends to the bottom of the hole or is formed on the mesa to make contact with the first window layer 220 of the first conductive type semiconductor layer. More preferably, in order to prevent the first electrode from contacting the second conductive type semiconductor layer and the light-emitting layer at the sidewall of the hole or the sidewall forming the mesa, the first electrode 205 may be insulated from the sidewall of the hole or the sidewall forming the mesa by an insulating layer.

As shown in FIG. 1, to achieve a good ohmic contact between the first electrode 205 and the n-type first window layer 220, the n-type first window layer 220 has a low-resistance region 207 located around the first electrode 205, which has a lower resistance than the surrounding n-type first window layer 220 outside the low-resistance region. The low-resistance region 207 may be formed in a way that diffusion metal contained in the first electrode 205 is diffused into the n-type first window layer 220 and located around the first electrode 205. The diffusion metal may be derived from the electrode material of the first electrode which preferably includes, for example, gold, germanium, nickel or alloy of any combination of these metals or further includes a single-component metal layer in contact with the n-type first window layer 220, such as gold. After the electrode is formed in the hole or on the mesa, the metal diffusion can be realized by high temperature fusion to obtain the low-resistance region. The high temperature fusion is conducted at a temperature of 300° C. or more, more preferably 420~520° C. or more, for 1 to 30 min.

The second electrode 206 is located at one side of the second conductive type semiconductor layer, and is in contact with the p-type second window layer 224 at one side of second conductive type semiconductor layer. The second electrode 206 may include at least one of alloy such as gold beryllium, gold zinc, or transparent conductive materials such as ITO, IZO as ohmic contact materials. More preferably, the second electrode 206 may also include a reflective metal such as gold or silver to reflects a part of the light emitted from the light-emitting layer and passing through the second window layer 224 of the second conductive type semiconductor layer back to the semiconductor light-emitting sequence, such that the light is emitted from the light-emitting side.

More preferably, an insulating layer (not shown in the figures) is formed at one side of the p-type window layer 224 of the second conductive type semiconductor layer. The insulating layer has a plurality of openings to expose the side of the p-type window layer 224. The second electrode 206 makes a plurality of contacts with the p-type window layer 224 through the plurality of openings in the insulating layer. The insulating layer is preferably made of a light-transmissive material, and the insulating layer may be at least one of the materials of fluoride, oxide, or nitride, for example, silicon nitride, silicon oxide, magnesium fluoride, calcium fluoride. The second electrode is in contact with the p-type window layer 224 through the plurality of openings in the insulating layer to ensure even current spreading between the second electrode and the window layer. More preferably, the second electrode further includes a reflective metal covering the surface of the insulating layer, such as gold or silver. The reflective metal and the insulating layer can form a fully reflective structure which increases the reflectivity. A transparent conductive adhesive layer such as at least one of ITO, IZO or the like may also be provided between the reflective metal and the insulating layer to increase the adhesion effect.

The first electrode 205 and the second electrode 206 are located at an opposite side to the light-emitting side of the semiconductor light-emitting sequence, and the first electrode 205 and the second electrode 206 may be in contact with an external electrical connection to form a conventional flip-chip structure. The first electrode 205 and the second electrode 206 may also include top metal pad, which may be at least one layer of gold, aluminum or the like, allowing the the first electrode 205 and the second electrode 206 to be flip-chipped on a substrate of a package or an application. The first electrode 205 and the second electrode 206 may be equal or unequal in height. The metal pad of the first electrode and the second electrode do not overlap in the thickness direction.

This structure is suitable for the case that the size of the semiconductor light-emitting sequence of the semiconductor light-emitting device ranges from 1 μm to 2000 μm. The size is defined as that a projection of the semiconductor light-emitting sequence perpendicular to the thickness direction has a length and a width, both of which are between 1 μm and 2000 μm. Specifically, taking a miniature light-emitting diode of 1~100 μm or a sub-micron light-emitting diode of 100~300 μm as an example, they can be widely used in display and other fields. The sub-micron light-emitting diode may include a permanent transparent substrate located at the light-emitting side, such as sapphire, glass or quartz.

Embodiment II

This embodiment provides a light-emitting diode suitable for using an electrode-side support substrate. The specific size of the semiconductor light-emitting sequence is between 1 and 2000 μm. A better size is defined as that the projection of the semiconductor light-emitting sequence perpendicular to the thickness direction has a length and a width, both of which are greater than 300 μm, and more preferably the size is 700 μm or more.

Figure 2:
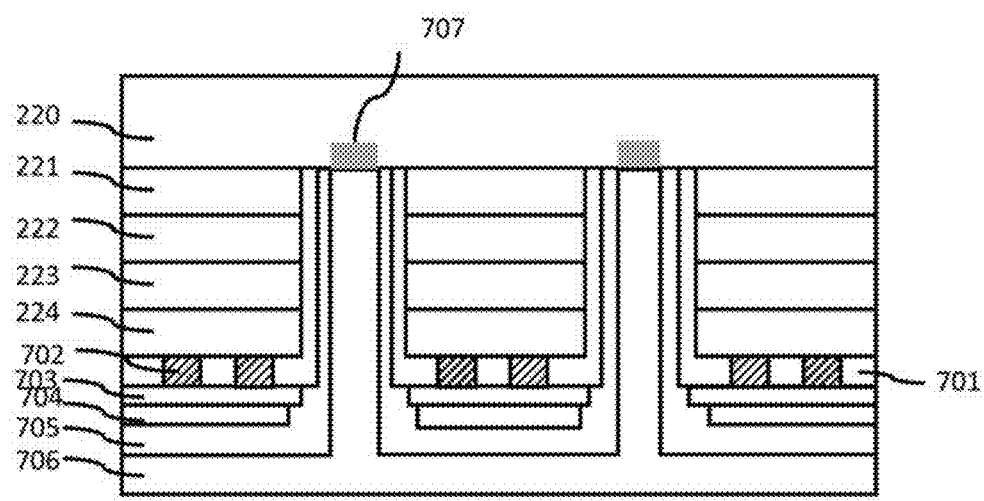
FIGS. 2-5 are schematic diagrams of a structure of the semiconductor light-emitting device according to the embodiment II.

The structure of the semiconductor light-emitting device is shown in FIG. 2, which includes a semiconductor light-emitting sequence. The semiconductor light-emitting sequence includes a first conductive type semiconductor layer, a light-emitting layer, and a second conductive type semiconductor layer. The first conductive type semiconductor layer includes an n-type first window layer 220 and an n-type first cladding layer 221. The light-emitting layer 222 is a multiple quantum well. The second conductive type semiconductor layer includes a p-type second cladding layer 223 and a p-type second window layer 224. The first window layer 220 of the first conductive type semiconductor layer is at the light-emitting side. The first electrode 706 and the second electrode (702, 703, 704) are in electrical contact with the first window layer 220 and the second window layer 224, respectively, and are both located at an opposite side to the light-emitting side, such that the first electrode and the second electrode will not block the emitted light at the light-emitting side.

Table 2 shows the main components of the semiconductor light-emitting sequence for details.

TABLE II

| No. | Functional Layer | Material | Thickness (nm) | Function |
|-----|------------------|----------|----------------|----------|
| 224 | p-type second window layer | GaP | 500~5000 | Ohmic contact, Current spreading |
| 223 | p-type second cladding layer | AlInP + Mg | 50~5000 | Providing holes |
| 222 | Light-emitting layer MQW | $Al_{n1}Ga_{1-n1}InP$/ $Al_{n2}Ga_{1-n2}InP$ ($0 \leq n1 < n2 \leq 1$) | 2~50 pairs | The light-emitting layer is the main factor that determines the wavelength and brightness of emitted light |
| 221 | n-type cladding layer | AlInP + Si | 50-5000 | Providing electrons |
| 220 | First window layer | $Al_{x1}Ga_{(1-x1)}InP$ | 2000~6000 | Ohmic contact |

The n-type first window layer 220 is Alx1Ga(1−x1)InP, where x1 is preferably between 0.4 and 1, more preferably, 0.6. The thickness of the n-type first window layer 220 is preferably 2~6 μm, more preferably, 3~5 μm. The p-type second window layer is GaP having a preferable thickness of 0.5~5 μm, more preferably, 0.5~2 μm. A doping concentration of the n-type first window layer is preferably 1E18 atoms/cm$^3$, more preferably, 1~2E18 atoms/cm$^3$. The doping concentration of the p-type second window layer GaP is preferably between 5E17 atoms/cm$^3$ and 9E19 atoms/cm$^3$.

The second conductive type semiconductor layer has a plurality of holes at one side which extends through the second conductive type semiconductor layer and the light-emitting layer 222, with the bottom thereof located at the first window layer 220 of the first conductive type semiconductor layer. The first electrode 706 includes a portion filled in the holes and forming a plurality of first electrical contacts at the bottom of the holes. The plurality of first electrical contacts are shaped as dots, and specifically, they may be circular, square, oval or polygonal. The plurality of first electrical contacts are uniformly or non-uniformly distributed at one side of the first window layer 220. The size of each first electrical contact is 1~20 um (the maximum diameter of the contact surface of the first electrical contact). The total area formed by the plurality of first electrical contacts is 0.5~20% of the cross-sectional area of one side of the first window layer, and the distance between adjacent first electrical contacts is 30~100 um.

The second electrodes 702, 703, 704 have two opposite sides, one of which covers the second conductive type semiconductor layer side and exposes the plurality of holes. The first electrode 706 includes an extended part extending out of the holes and located at the other side of the second electrodes 702, 703, 704. The extended part of the first electrode 706 and the other side of the second electrode 702, 703, 704 form a sandwich structure with an insulating layer 705. The insulating layer 705 includes a part located between the extended part of the first electrode 706 and the other side of the second electrode 702, 703, 704 to provide insulation and isolation. The insulating layer 705 also covers the sidewall of the holes, and is located between the portion of the first electrode 706 filled in the holes and the sidewall of the holes. The specific material of the insulating layer 705 may include nitride, oxide, specifically insulating layer materials such as silicon nitride, silicon oxide, and zinc oxide.

The second electrodes 702,703,704 form an ohmic contact at one side of the second conductive type semiconductor layer, including an ohmic contact layer 702 and a reflective layer 703. The ohmic contact layer 702 may be a combination of metal materials such as gold, beryllium, zinc, or a transparent conductive oxide such as ITO or IZO. One side of the second conductive type semiconductor layer may also include an insulating layer 701 which has a plurality of openings. The specific material of the insulating layer 701 may include nitride, oxide, specifically insulating layer materials such as silicon nitride, silicon oxide, and zinc oxide. Ohmic contact layer 702 is filled in the plurality of openings of insulating layer 701 to form a plurality of second electrical contacts. Reflective layer 703 is formed at the same side of the insulating layer 701 and the ohmic contact layer 702, for reflecting light radiation. The material of the reflective layer includes a metal such as gold or silver, or a combination of a metal transparent conductive layer and gold or silver, etc. Below the reflective layer 703 includes a metal diffusion barrier layer 704, such as a combination of metals such as titanium, platinum, or chromium.

The plurality of second electrical contacts have dot-like shape due to the plurality of openings of the insulating layer 701. Specifically, the dot-like shape may be circular, square, oval or polygonal, and the plurality of second electrical contacts are uniformly or non-uniformly distributed at one side of the second window layer, preferably in a uniform manner. The size of each second electrical contact is 1~300 um (the maximum diameter of the contact surface of each second electrical contact). The total area formed by the plurality of second electrical contacts is 0.5~20% of the cross-sectional area of one side of the second window layer.

Figure 3:
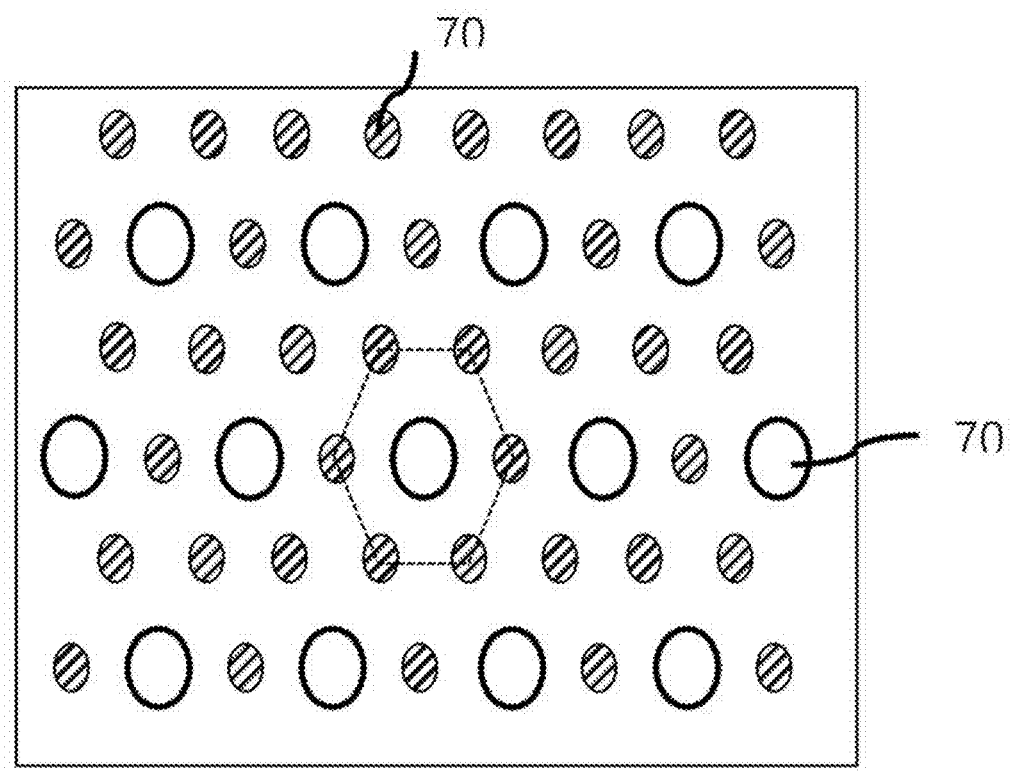

As shown in FIG. 3, when viewed downward from the first window layer 220 side, the plurality of second electrical contacts are arranged around one first electrical contact. Preferably, six second electrical contacts can be arranged around one first electrical contact, to form an equilateral hexagon or circular shape. The distance between any two adjacent second electrical contacts is 5~40 um. The distance between any second electrical contact and an adjacent first electrical contact is 10~30 um. By controlling the distance between adjacent second electrical contacts and the distance between the second electrical contact and the adjacent first electrical contact, the current spreads horizontally as evenly and as possible, and excessive concentration around the first electrical contact can be avoided.

Figure 4:
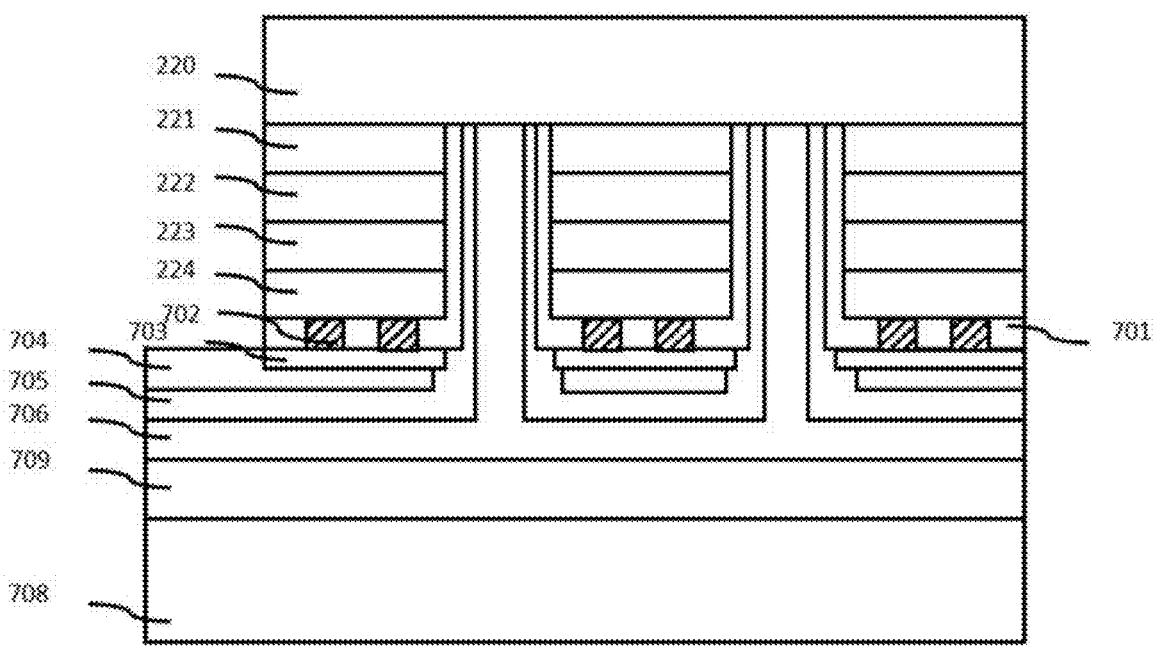

As shown in FIG. 4, at the back side of the extended portion of the first electrode 706 includes a support substrate 708 supporting the semiconductor light-emitting sequence. The support substrate 708 may be a conductive substrate such as silicon, silicon carbide, or a metal substrate such as copper, copper-tungsten alloy. At the back side of the conductive substrate may include a metal layer for the first electrode to be electrically connected externally.

The support substrate 708 is formed at the back side of the extended portion of the first electrode 706 through a bonding layer 709, which can be specifically formed by providing multiple layers of bonding metals and bonding them under high temperature and pressure. The bonding metals are selected from metals such as titanium, nickel, tin, platinum, gold, etc. In the case where the support substrate 708 is a conductive substrate, the bonding layer 709 requires a conductive material to electrically connect the first electrode 706 to the support substrate 708. More preferably, at least one layer of metal may be plated at the back side as an external electrical connection at the back side.

The second electrode may extend horizontally beyond the semiconductor light-emitting sequence and expose a portion of it, and the exposed portion of the second electrode faces toward one side of the semiconductor light-emitting sequence and includes a wire bonding electrode for external connection, thereby providing for external wire bonding at the same side as the light-emitting side.

Figure 5:
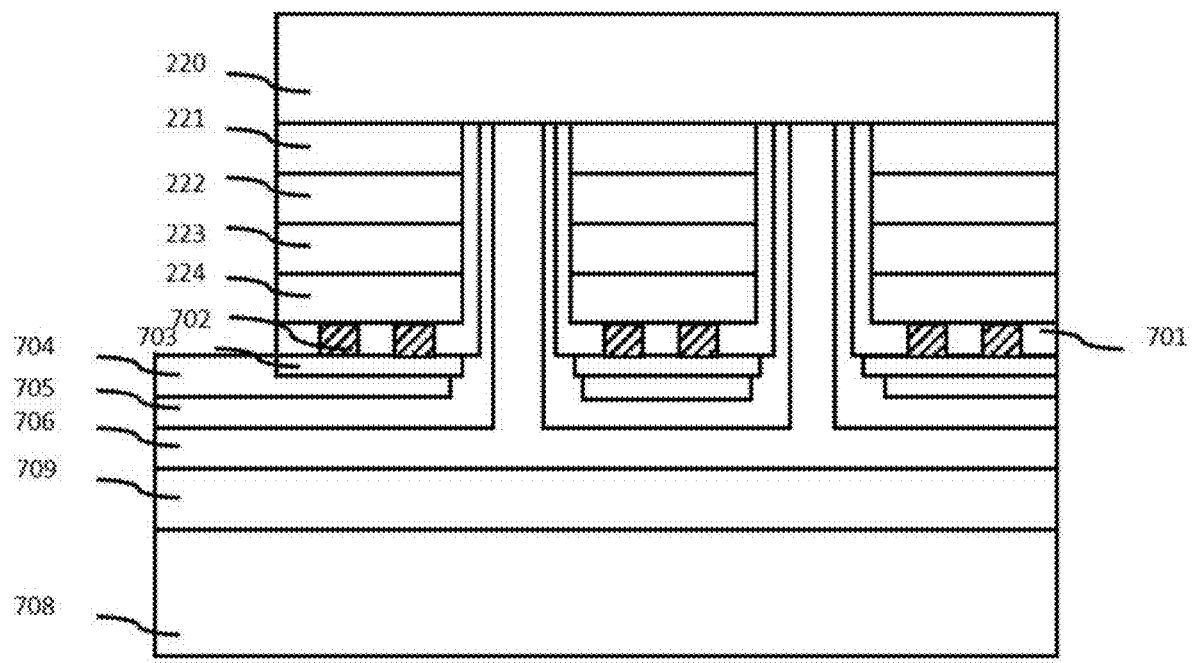

As shown in FIG. 5, the support substrate may be an insulating substrate and the bonding layer 709 may be either a metal material or an insulating material. The insulating layer includes one or more layers of materials such as titanium oxide, aluminum oxide or zinc oxide. The insulating substrate may be selected from materials such as aluminum nitride, sapphire, quartz, glass, or ceramic. In the case that the support substrate 708 is an insulating material, the extended portion of the first electrode 706 forming the sandwich structure may extend horizontally beyond the semiconductor light-emitting sequence and expose a portion of itself. The exposed portion of the first electrode 706 faces toward one side of the semiconductor light-emitting sequence and includes a wire bonding electrode for external connection, thereby providing for external wire bonding at the same side as the light-emitting side. The second electrode extends horizontally beyond the semiconductor light-emitting sequence and exposes a portion of itself, and the exposed portion of the second electrode faces toward one side of the semiconductor light-emitting sequence and includes a wire bonding electrode for external connection, thereby providing for external wire bonding at the same side as the light-emitting side.

As shown in FIG. 2, in order to form a good ohmic contact with the n-type first window layer 220, the n-type first window layer 220 has low-resistance regions 707 concentrated around the plurality of first electrical contacts. The low-resistance region 707 has a lower resistance than the material of a surrounding portion of the n-type first window layer 220 to facilitate good ohmic contact between the first electrode 706 and the first window layer 220. The low-resistance region 707 may be formed in a way that diffusion metal contained in the first electrode 706 is diffused into the n-type first window layer 220 from the first electrode 706 side to form a low-resistance region around the first electrical contact. The first electrode 706 is preferably made of a material including, for example, gold, germanium, nickel or alloy of any combination of these metals. The alloy includes a diffusible metal component, or further includes a single-component metal layer, such as gold, in contact with the n-type first window layer 220. In order to obtain the low-resistance regions, after the first electrodes are formed, metal diffusion may be conducted by high-temperature fusion at a temperature of 300° C. or more, more preferably 420~520° C., for 1~30 min.

Embodiment III

Figure 6:
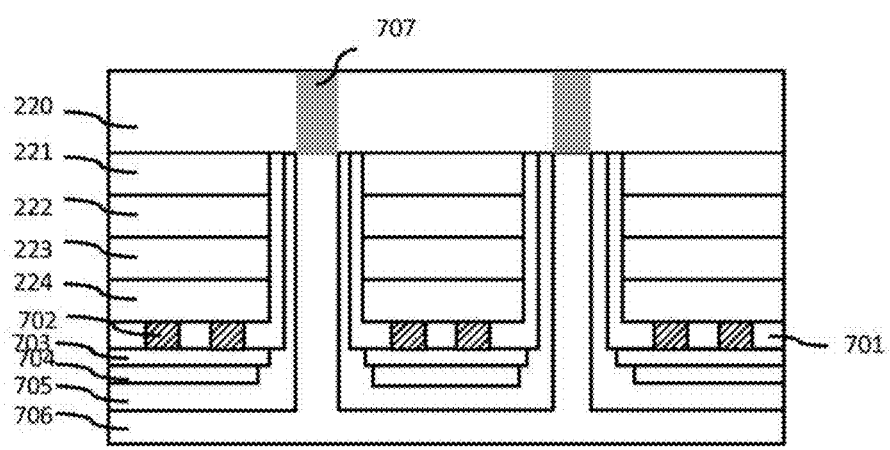
FIGS. 6-8 are schematic diagrams of a structure of the semiconductor light-emitting device according to the embodiment III.

An alternative embodiment of Embodiment II is provided. As shown in FIG. 6, more preferably, the diffusion metal may further diffuse from the plurality of first electrical contacts to the light-emitting surface side of the n-type first window layer 220 to form the low-resistance regions 707, whereby the low-resistance region 707 runs from the plurality of first electrical contacts to the light-emitting surface side in the thickness direction of the n-type first window layer 220. Specifically, after conventional operations such as evaporation, sputtering or electroplating to obtain each layer of metal, a high-temperature fusion step is required to obtain the low-resistance region 707, with a preferable temperature of 460~490° C. and a duration of 15~20 min, to realize diffusion of the diffusion metal from the first electrode to the light-emitting surface side in the thickness direction of the n-type first window layer 220. The temperature and duration of high-temperature fusion can effectively ensure the diffusion of the diffusion metal to the surface side of the n-type first window layer 220. Specifically, the first electrode has at least a first layer of metal at the bottom of the hole, such as gold, with a thickness of 10~50 nm, more preferably with a thickness of 30~40 nm, a second layer of metal alloy such as gold germanium nickel or gold germanium, which may be at least 50 nm in thickness, more preferably 80~150 nm in thickness, and a thicker layer of metal, such as gold, with a thickness of 200~400 nm.

Figure 7:
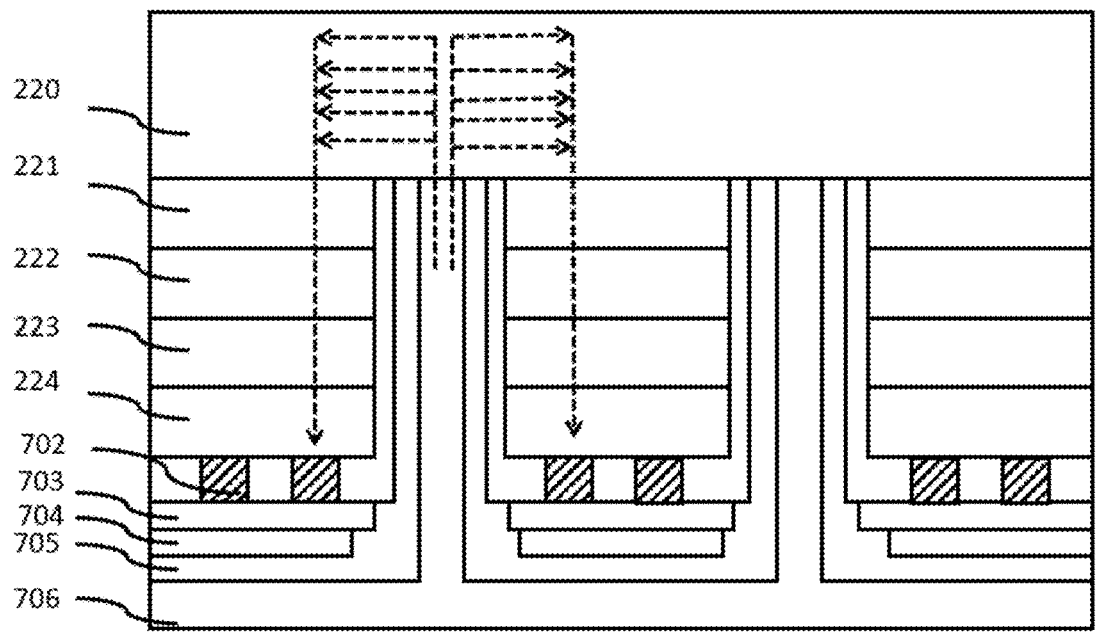

As shown in FIG. 7, The direction of the arrow in the figure indicates the general direction of flow of current (electrons) from the first conductive type semiconductor layer side to the second conductive type semiconductor layer side in the case of energizing the semiconductor light-emitting sequence. The low-resistance region 707 runs through the thickness of the n-type first window layer 220 from the plurality of first electrical contacts to the light-emitting surface side. According to the formula for resistance: $R=\rho L/S$, the low-resistance region promotes the longitudinal flow of current (electrons) along the thickness direction of the n-type first window layer 220, which can effectively increase the area for the horizontal flow of current (electrons) in the n-type first window layer 220 and reduce the horizontal resistance of the n-type first window layer 220, thus facilitating the horizontal flow of current (electrons) from the first electrical contact side, and then the longitudinal flow through the light-emitting layer to the p-type second cladding layer 223 and p-type second window layer 224. In this way, it avoids the current concentration in the first electrical contact side, which otherwise results in uneven light-emitting.

Figure 8:
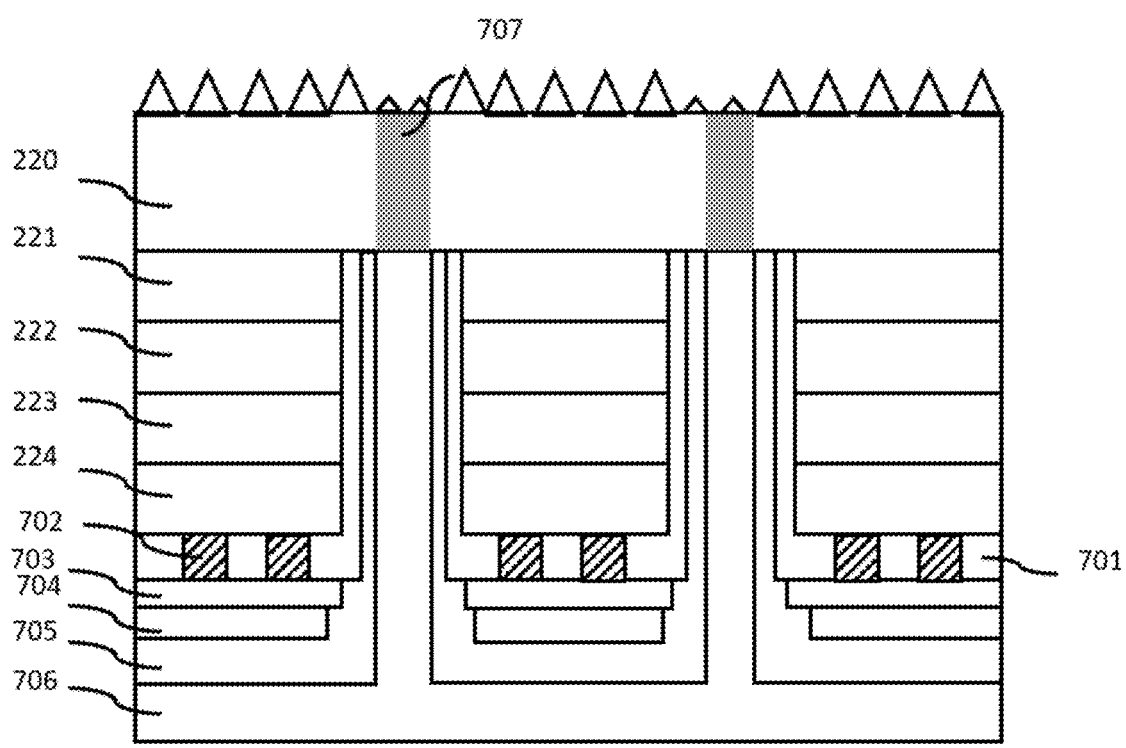

As shown in FIG. 8, when the n-type first window layer 220 is used to provide a light-emitting surface, an unevenness process may be conducted to create an uneven surface in order to increase the light-emitting efficiency. The unevenness process may include roughening or patterning. When the diffusion metal is diffused to the light-emitting side surface of the n-type first window layer 220, a low-resistance region is formed. After the roughening or patterning process of the light-emitting surface, the unevenness formed on the surface of the low-resistance area will be different from the unevenness of the surface of the surrounding n-type first window layer 220. This is due to the diffusion of the diffusion metal into the n-type window layer 220, resulting in disruption of the material lattice at one side of the n-type window layer. The region where the lattice is disrupted forms the low-resistance region 707 which has a different morphology of material than that of the surrounding region where metal diffusion is not conducted, and thus different unevenness is formed after the unevenness process of the surface.

Figure 9:
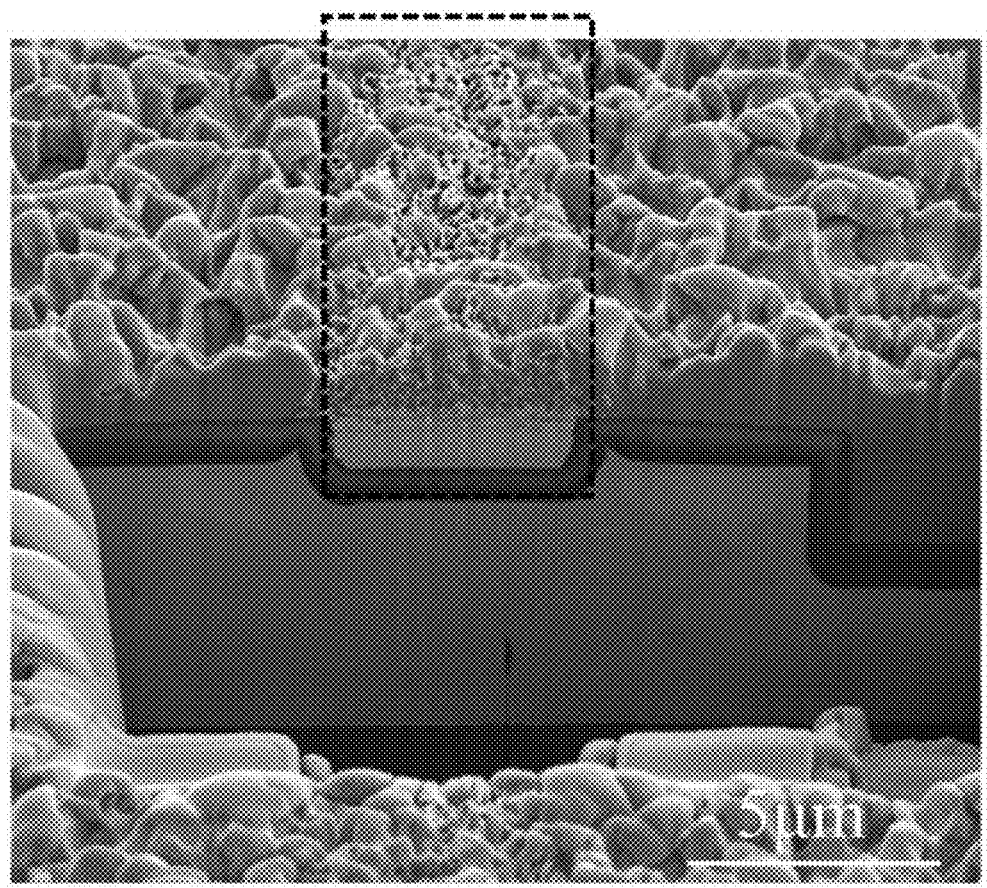
FIG. 9 is a local SEM image of a semiconductor light-emitting device according to the embodiment III.

FIG. 9 provides an actual local SEM image of the lighting emitting side surface of the n-type first window layer of a semiconductor light-emitting device after being roughened, where the dashed area represents a low-resistance region formed above the first electrical contact. From the figure, it can be seen that the roughness of the lighting emitting side surface of the n-type first window layer above the low-resistance region is different from the roughness of the surrounding surface.

Embodiment IV

As a better implementation of Embodiment II, according to the formula for sheet resistance: $Rs=\rho/L$, where $\rho$ is the resistivity of a material and L is the thickness of the material, the greater the doping concentration of the material, the more it can reduce the resistivity and thus the sheet resistance. The greater the thickness of the material, the lower the sheet resistance. Thus, preferably, the sheet resistance Rn of the n-type first window layer 220 is 0.01~1 Ω/□, more preferably, 0.03~0.1 Ω/□, and specifically, it may be 0.3 Ω/□. The sheet resistance Rp of the p-type second window layer 224 is 1~10 Ω/□, and specifically, it may be 4 Ω/□. More preferably, the ratio of the sheet resistance of the aluminum gallium indium phosphorus window layer to the sheet resistance of the second window layer is at most 1:10, more preferably, 1:(10 to 100), 1:(100 to 1000) or 1:(100 to 10000). Since the sheet resistance of the n-type first window layer 220 is smaller and the sheet resistance of the p-type second window layer 224 is larger, it may facilitate the formation of horizontal current spreading at the n-type first window layer 220 side and longitudinal current spreading at the p-type second window layer 224 side, thereby avoiding the concentration of current at the first electrical contact region.

The thickness ratio of the n-type first window layer 220 to the p-type second window layer 224 is preferably greater than or equal to 2:1, more preferably greater than or equal to 5:1, and more preferably 10:1. The thickness of the p-type second window layer 224 is 0.1~2 um, preferably 0.5 um. The thickness of the n-type first window layer 220 is 2~6 um, more preferably 5 μm.

Embodiment V

In order to form a low-resistance region, this embodiment provides an alternative to the formation of diffusion metal by high-temperature fusion of the first electrode, i.e. by ion implantation. The dopant ions used for ion implantation are positively charged elements such as magnesium ions, iron ions, zinc ions, silicon ions, carbon ions. The dopant ions are formed near a plurality of first electrical contacts by means of local ion implantation to form local high doping, i.e., low-resistance regions. The ion implantation can be done from the first electrical contact side of the first window layer, and the depth of implantation can be controlled such that it passes through the n-type first window layer 220 to a surface opposite to the surface where the first electrical contact is located. The concentration of the implanted dopant ions formed in the low-resistance regions ranges from 1E17 atoms/cm$^3$ to 1E20 atoms/cm$^3$. Ion implantation can be followed by activation of the dopant ions by high-temperature annealing at 300~600° C.

Embodiment VI

Figure 10:
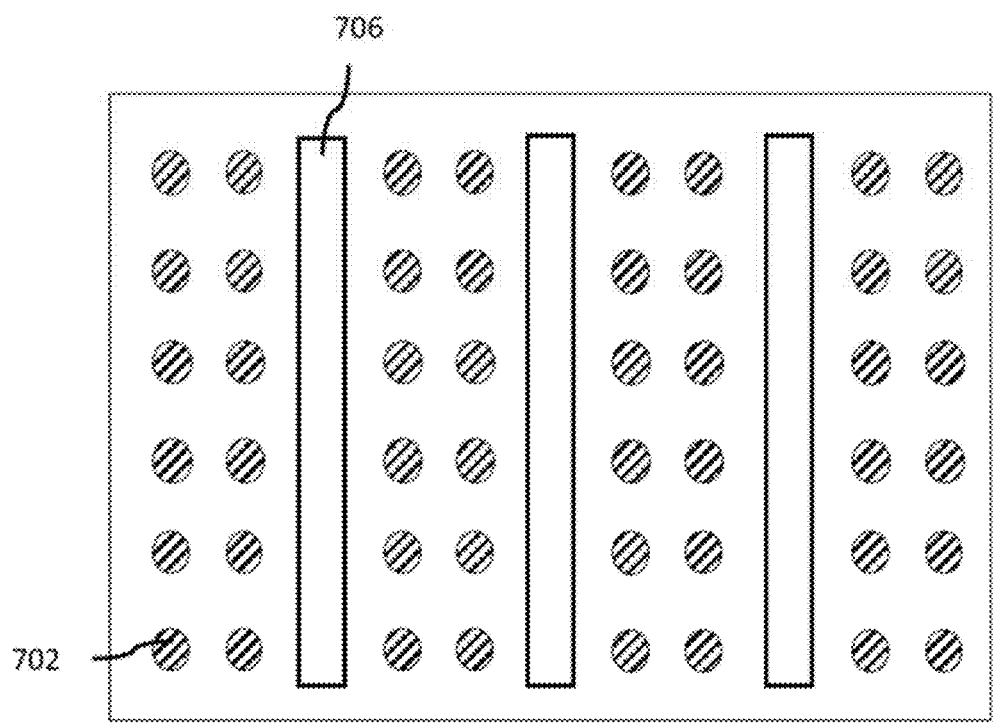
FIG. 10 is a schematic diagram of a structure of the semiconductor light-emitting device according to the embodiment VI.

As an alternative to Embodiment II, the shape of the plurality of first electrical contacts of the first electrode is a strip, and the size of the strip in the width direction is 1~20 um. The number of the strip is at least one or more, and the area percentage is 5%~30%. The plurality of second electrical contacts of the second electrode have a dot-like shape, and a more specific shape of the dot-like shape includes at least one of a circle, a square, a polygon or an ellipse. The maximum diameter of the area occupied by the dot is defined as the size of the dot, which is 5~60 um. As shown in FIG. 10, the plurality of second electrical contacts 702 of the second electrodes are located around the strip-shaped first electrical contacts of the first electrodes 706 as viewed out of the n-type first window layer side. The distance between one second electrical contact and one adjacent first electrical contact is 5~40 um. Every four dots of adjacent plurality of the second electric contacts forms a square as a unit, and these units are repeatedly arranged at one side or both sides of the strips, as shown in FIG. 10. The repeating units may also be rhombus, quadrilateral or hexagonal, for arrangement.

Embodiment VII

As an alternative to Embodiment I, a semiconductor light-emitting device having a semiconductor light-emitting sequence as follows is provided. The semiconductor light-emitting device has the same structure as that in FIG. 1. The semiconductor light-emitting sequence includes a first conductive type semiconductor layer including a p-type first cladding layer 223 and a p-type first window layer 224. The p-type first window layer 224 is directly located at the light-emitting side. A second conductive type semiconductor layer includes an n-type second cladding layer and an n-type second window layer. The n-type second window layer is GaP or GaAs. The p-type first window layer selects Al$_{x1}$Ga$_{(1-x1)}$InP which has a better light transmission, replacing the conventional n-type GaAs and p-type GaP as the window layer at the light-emitting side. It can thus effectively reduce the light absorption effect and improve the light-emitting rate. A good thickness is 2~6 μm, preferably 2000~4000 nm, and more preferably 2500~4500 nm. To effectively ensure current spreading, a good doping concentration is 1E18 atoms/cm$^3$ or more. The material of the first electrode includes a combination of gold/gold zinc/gold or gold/gold beryllium/gold, and the contact material between the p-side electrode and the p-type first window layer needs to be the first layer of gold with a thickness of 1~50 nm, and preferably, the thickness of the first layer of gold of the first electrode for contact is 5~20 nm. In order to improve the ohmic contact effect, a fusion process at a high temperature of at least 300° C. or more is used, and more preferably, a fusion process at least 480° C. is conducted for the first electrode to form low-resistance regions, more preferably with a duration of 10~15 min. The low-resistance regions can be further extended to the light-emitting side.

The main components of the semiconductor light-emitting sequence are shown in Table III.

TABLE III

| No. | Functional Layer | Material | Thickness (nm) | Function |
| --- | --- | --- | --- | --- |
| 224 | p-type window layer | Al$_{x1}$Ga$_{(1-x1)}$InP | 2000~4000 | Ohmic contact, current spreading, and light-emitting layer |
| 223 | p-type cladding layer | AlInP + Mg | 50~5000 | Providing holes |
| 222 | Light-emitting layer MQW | Al$_{n1}$Ga$_{1-n1}$InP/ Al$_{n2}$Ga$_{1-n2}$InP (0 ≤ n1 < n2 ≤ 1) | 2~50 pairs | The light-emitting layer is the main factor that determines the wavelength and brightness of emitted light |
| 221 | n-type cladding layer | AlInP + Si | 50-5000 | Providing electrons |
| 220 | n-type window layer | GaP or GaAs | 500~5000 | Ohmic contact and current spreading |

According to various embodiments of the present invention, by selecting aluminum gallium indium phosphorous as the ohmic contact layer and the window layer at the first electrode side of the first conductive type semiconductor layer, instead of a conventional light-absorbing ohmic contact material, the light transmittance can be effectively improved. The ohmic contact can be effectively improved by forming a low-resistance region by diffusing the diffusion metal at the electrode side of the first electrical contact into the window layer, or by ion implantation. More preferably, the low-resistance region reaches the surface of the window layer, which facilitates horizontal current spreading along the whole window layer and avoids the concentration of the current around the first electrode.

The above-described embodiments of the present invention are merely illustrative of the principles and effects of the present invention, and are not intended to limit the present invention. Modifications or variations of the above-described embodiments may be made by those skilled in the art without departing from the spirit and scope of the invention. Therefore, all equivalent modifications or changes made by those skilled in the art without departing from the spirit and scope of the invention will be covered by the appended claims.

What is claimed is:

1. A semiconductor light-emitting device, comprising:
    a semiconductor light-emitting sequence, the semiconductor light-emitting sequence comprising a first conductive type semiconductor layer, a second conductive type semiconductor layer and a light-emitting layer between the first type conductive semiconductor layer and the second type conductive semiconductor layer;
    a first electrode electrically connected to the first conductive type semiconductor layer; and
    a second electrode electrically connected to the second conductive type semiconductor layer,
    wherein the first conductive type semiconductor layer comprises an aluminum gallium indium phosphorus window layer as an ohmic contact layer forming contact between the first electrode and the first conductive type semiconductor layer;
    wherein the aluminum gallium indium phosphorus window layer has a low-resistance region located around the first electrode and having a lower resistance than other regions in the aluminum gallium indium phosphorus window layer, and the low-resistance region extends along a thickness direction from the position where the first electrode contacts one side of the aluminum gallium indium phosphorus window layer to the opposite side of the aluminum gallium indium phosphorus window layer;
    wherein a surface of the aluminum gallium indium phosphorus window layer opposite to a surface contacting the first electrode acts as a light-emitting surface which is made to be uneven, and the low-resistance region extends from a position where the first electrode contacts the first conductive type semiconductor layer to the light-emitting surface of the aluminum gallium indium phosphorus window layer, the unevenness of the low-resistance region being different from that of the surrounding non-low-resistance region.

2. A semiconductor light-emitting device according to claim 1, wherein the low-resistance region is formed by diffusion of metal or ion implantation.

3. A semiconductor light-emitting device according to claim 2, wherein the low-resistance region is formed by diffusion of a diffusion metal of the first electrode into the aluminum gallium indium phosphorus window layer.

4. A semiconductor light-emitting device according to claim 1, wherein the second conductive type semiconductor layer has a plurality of holes at one side thereof, the plurality of holes extending through the second conductive type semiconductor layer and the light-emitting layer to the first conductive type semiconductor layer, with bottom of the holes being located at the aluminum gallium indium phosphorus window layer, the first electrode being located at one side of the second conductive type semiconductor layer and extending to the bottom of the holes to form a plurality of first electrical contacts, the second electrode covering one side of the second conductive type semiconductor layer and exposing the plurality of holes.

5. A semiconductor light-emitting device according to claim 1, wherein the aluminum gallium indium phosphorus window layer comprises $Al_{x1}Ga_{1-x1}InP$, wherein $0.4<x1\leq1$.

6. A semiconductor light-emitting device according to claim 1, wherein the low-resistance region is homogeneous with the surrounding non-low-resistance region of the aluminum gallium indium phosphorus window layer.

7. A semiconductor light-emitting device according to claim 1, wherein the aluminum gallium indium phosphorus window layer is $Al_{x1}Ga_{1-x1}InP$, with x1 between 0.6 and 0.8 and a thickness of 2 to 6 µm.

8. A semiconductor light-emitting device according to claim 4, wherein the second conductive type semiconductor layer comprises a second window layer, a plurality of second electrical contacts being formed at a plurality of contact points between the second electrode and the second window layer.

9. A semiconductor light-emitting device according to claim 8, wherein a distance between any one of the second electrical contacts and an adjacent first electrical contact is 10~30 um.

10. A semiconductor light-emitting device according to claim 8, wherein a distance between any two adjacent second electrical contacts is 5~40 um, and a distance between any two adjacent first electrical contacts is 30~100 um.

11. A semiconductor light-emitting device according to claim 8, wherein a ratio of thickness of the aluminum gallium indium phosphorus window layer to the second window layer is greater than or equal to 5:1.

12. A semiconductor light-emitting device according to claim 1, wherein the first conductive type semiconductor layer comprises a first cladding layer providing electrons or holes, and the second conductive type semiconductor layer comprises a second cladding layer providing electrons or holes.

13. A semiconductor light-emitting device according to claim 1, wherein a surface of the aluminum gallium indium phosphorus window layer opposite to a surface contacting the first electrode acts as a light-emitting surface.

14. A semiconductor light-emitting device according to claim 1, wherein the first electrode has one or more strip-shaped contacts.

15. A semiconductor light-emitting device according to claim 1, wherein the aluminum gallium indium phosphorus window layer of the semiconductor light-emitting sequence comprises a transparent substrate at one side thereof.

16. A semiconductor light-emitting device according to claim 1, wherein the first conductive type is n-type or p-type.

17. A semiconductor light-emitting device according to claim 1, wherein the first electrode comprises a first layer of metal gold, a second layer of metal alloy of gold germanium nickel or gold germanium, and a third layer of gold.

* * * * *